(12) United States Patent
Perthold (10) Patent No.: US 10,418,974 B2
(45) Date of Patent: Sep. 17, 2019

(54) APPARATUS FOR MODIFYING A SAMPLING RATE SYSTEM INCLUDING AN APPARATUS FOR MODIFYING A SAMPLING RATE AND METHOD FOR MODIFYING A SAMPLING RATE

(71) Applicant: Innovationszentrum für Telekommunikationstechnik GmbH IZT, Erlangen (DE)

(72) Inventor: Rainer Perthold, Weisendorf (DE)

(73) Assignee: Innovationszentrum für Telekommunikationstechnik GmbH IZT, Erlangen (DE)

( * ) Notice: Subject to any disclaimer, the term of this patent is extended or adjusted under 35 U.S.C. 154(b) by 0 days.

(21) Appl. No.: 15/884,097

(22) Filed: Jan. 30, 2018

(65) Prior Publication Data

US 2018/0152173 A1  May 31, 2018

Related U.S. Application Data

(63) Continuation of application No. PCT/EP2016/068310, filed on Aug. 1, 2016.

(30) Foreign Application Priority Data

Aug. 5, 2015  (DE) .................. 10 2015 214 950

(51) Int. Cl.
 *G06F 17/10* (2006.01)
 *H03H 17/02* (2006.01)
(52) U.S. Cl.
 CPC .... *H03H 17/0227* (2013.01); *H03H 17/0213* (2013.01); *H03H 17/0233* (2013.01); *H03H 2017/0214* (2013.01)

(58) Field of Classification Search
 None
 See application file for complete search history.

(56) References Cited

U.S. PATENT DOCUMENTS

| | | | | |
|---|---|---|---|---|
| 8,549,060 B2* | 10/2013 | Gruener | .................. | G01S 3/026 708/303 |
| 8,782,110 B2* | 7/2014 | Christoph | .......... | H03H 17/0213 708/315 |

(Continued)

FOREIGN PATENT DOCUMENTS

| | | |
|---|---|---|
| JP | H0846555 A | 2/1996 |
| WO | 2008031504 A2 | 3/2008 |
| WO | 20100076727 A1 | 7/2010 |

OTHER PUBLICATIONS

Crochiere, Ronald E. et al., "Interpolation and Decimation of Digital Signals—A Tutorial Review", Proceedings of the IEEE; vol. 69; Mar. 1981; Issue 3; pp. 300-331.

*Primary Examiner* — David H Malzahn
(74) *Attorney, Agent, or Firm* — Michael A. Glenn; Perkins Coie LLP (57) ABSTRACT

An apparatus for modifying a sampling rate includes a forward transformer for forming a first version of a spectrogram by means of transformation with a first transformation length from an information signal with a first sampling rate. The apparatus includes a processor for forming a second version of the spectrogram with a lower bandwidth than the first version. The apparatus includes a reverse transformer for forming a coarsely pre-modified information signal with a second sampling rate that is reduced with respect to the first sampling rate, by means of reverse transformation of the second version of the spectrogram with a second transformation length that is reduced with respect to the first transformation length. The apparatus includes a time domain interpolator for acquiring an infor- (Continued)

mation signal with a third sampling rate that is modified with respect to the second sampling rate, by means of interpolation of the pre-modified information signal.

16 Claims, 9 Drawing Sheets

(56) References Cited

U.S. PATENT DOCUMENTS

| | | | | |
|---|---|---|---|---|
| 2010/0121617 | A1* | 5/2010 | Gruener | G01S 3/026 |
| | | | | 703/2 |
| 2010/0208905 | A1* | 8/2010 | Franck | H04S 3/008 |
| | | | | 381/59 |
| 2013/0287226 | A1 | 10/2013 | Kerner et al. | |
| 2018/0152173 | A1* | 5/2018 | Perthold | H03H 17/0213 |

\* cited by examiner

APPARATUS FOR MODIFYING A SAMPLING RATE SYSTEM INCLUDING AN APPARATUS FOR MODIFYING A SAMPLING RATE AND METHOD FOR MODIFYING A SAMPLING RATE

CROSS-REFERENCE TO RELATED APPLICATIONS

This application is a continuation of copending International Application No. PCT/EP2016/068310, filed Aug. 1, 2016, which is incorporated herein by reference in its entirety, and additionally claims priority from German Application No. 10 2015 214 950.1, filed Aug. 5, 2015, which is also incorporated herein by reference in its entirety.

The present invention relates to an apparatus for modifying a sampling rate, to a system including an apparatus for modifying a sampling rate, to a method for modifying a sampling rate and to a computer program.

BACKGROUND OF THE INVENTION

Applications in the field of signal processing and/or data processing necessitate decimation of a digitized signal. Decimation means a reduction of the bandwidth of a digitized signal with simultaneous reduction of the sampling rate of the digitized signal.

Decimation can be obtained, for example, by means of a polyphase filter. A polyphase filter represents a common method for decimation with variable sampling rate purely in the time domain. Here, the impulse response of the decimation filter is stored in a heavily oversampled manner, for example with a factor of n=1024. Depending on the output clock, the shifting chain of the used FIR filter (FIR=Finite Impulse Response) is shifted by n steps. At the same time, the input data are stored in the shifting chain with the distance m corresponding to the desired decimation rate and weighted with the respective coefficient of the FIR filter. Normally, m is not an integer number and the matching coefficient is selected by means of "nearest neighbor".

Alternatively, linear interpolation is performed between two coefficients. However, the method does have disadvantages. At high relative bandwidths, respective long filters become necessitated which disproportionally increase the computing time requirements. Without linear interpolation between coefficients, the factor n has to be selected to be large, for example in the range of 10000 in order to obtain good signal quality. This results in high storage requirements. However, if linear interpolation is used, a lower number of coefficients can be used. In turn, the calculations become more complex. Further, the complex structure of the memory of the filter complicates parallel/distributed processing of the data in several processor cores.

A so-called Farrow interpolator represents a combination of a short FIR filter and a polynomial interpolation. Disadvantages are a bad SFDR (spurious free dynamic range) in the range of approximately 50 dB as well as the necessity of having to limit the bandwidth of the signal prior to the actual interpolator. This results in additional computing effort. Thus, for applications in measurement technology and radio detection, the Farrow interpolator is usually not applicable.

A pure polynomial interpolation of the input data for determining the output data at the necessitated times has the same disadvantages as the Farrow interpolator and is hence also not applicable.

Decimation in the frequency domain by means of fast convolution can be performed in the frequency domain when different lengths for a fast Fourier transformation (FFT) with a transformation length N1-FFT(N1) and an inverse FFT with the transformation length N2-IFFT(N2) with N1>N2 are used on the input and output side and the filter characteristic has been selected such that after applying the window a maximum of N2 frequency bins (frequency bin=frequency line of the spectrum) have to be considered. The sampling rate at the input relates to the sampling rate at the output like N1/N2. A disadvantage of the this method is that N1 and N2 have to be at least integer for enabling realization by discrete Fourier transformation (DFT), which is very inefficient and not practical. A further disadvantage is that usually only for powers of two of N1 and N2 relevant implementations are available for microprocessors, such as for a Cooley-Tukey Transformation. Prime factor FFTs are also significantly less efficient, only available for specific ratios between N1/N2 and normally not included in program libraries.

Thus, there is a need for efficient and flexible algorithms for decimation of sampling rates.

SUMMARY

According to an embodiment, an apparatus for modifying a sampling rate may have: a forward transformer for forming a first version of a spectrogram by means of transformation with a first transformation length from an information signal with a first sampling rate; a processor for forming a second version of the spectrogram with a bandwidth that is modified with respect to the first version; a reverse transformer for forming a coarsely pre-modified information signal with a second sampling rate that is modified with respect to the first sampling rate, by means of reverse transformation of the second version of the spectrogram with a second transformation length that is modified with respect to the first transformation length; and a time domain interpolator for acquiring an information signal with a third sampling rate that is modified with respect to the second sampling rate, by means of interpolation of the pre-modified information signal.

Another embodiment may have a system having an inventive apparatus, wherein the system is configured to output a signal that is based on the information signal.

According to anther embodiment, a method for modifying a sampling rate may have the steps of: forming a first version of a spectrogram by means of transformation with a first transformation length from an information signal with a first sampling rate; forming a second version of the spectrogram with a lower bandwidth than the first version; forming a coarsely pre-modified information signal with a second sampling rate that is modified with respect to the first sampling rate, by means of reverse transformation of the second version with a second transformation length that is modified with respect to the first transformation length; and acquiring an information signal with a third sampling rate that is modified with respect to the second sampling rate, by means of interpolation of the pre-modified information signal.

Another embodiment may have a non-transitory digital storage medium having a computer program stored thereon to perform the method for modifying a sampling rate, the method having the steps of: forming a first version of a spectrogram by means of transformation with a first transformation length from an information signal with a first sampling rate; forming a second version of the spectrogram with a lower bandwidth than the first version; forming a coarsely pre-modified information signal with a second sampling rate that is modified with respect to the first sampling rate, by means of reverse transformation of the second version with a second transformation length that is modified with respect to the first transformation length; and acquiring an information signal with a third sampling rate that is modified with respect to the second sampling rate, by means of interpolation of the pre-modified information signal, when said computer program is run by a computer.

A core idea of the present invention is the finding that decimation can be obtained based on two modifications of the sampling rate. A first coarsely pre-modified sampling rate can be obtained based on a first modification with an efficient ratio. Based on a second modification of the sampling rate by using interpolation, the obtained pre-modified sampling rate can be adapted, i.e., changed. The interpolation is flexible with respect to the degree of modification of the sampling rate, wherein the overall concept remains efficient. In that way, a flexible sampling rate can be obtained in an efficient manner.

According to an embodiment, an apparatus for modifying a sampling rate includes a forward transformer for forming a first version of a spectrogram by means of transformation with a first transformation length from an information signal with a first sampling rate. The apparatus includes a processor for forming a second version of the spectrogram comprising a lower bandwidth than the first version. The apparatus includes a reverse transformer for forming a coarsely pre-modified information signal by means of reverse transformation of the second version of the spectrogram with a second transformation length that is reduced with respect to the first transformation length. The second sampling rate is reduced with respect to the first sampling rate. Further, the apparatus includes a time domain interpolator for obtaining an information signal with a third sampling rate that is modified with respect to the second sampling rate. The time domain interpolator is configured to obtain the information signal with the third sampling rate by means of interpolation of the pre-modified information signal. It is an advantage of this embodiment that the second sampling rate can be adapted by means of the time domain interpolator.

According to a further embodiment, the time domain interpolator is configured to obtain sampling values of the third sampling rate by means of polynomial interpolation, wherein the polynomial interpolation is based on sampling values of the second sampling rate. It is an advantage of this embodiment that the polynomial interpolation can be performed based on the band-limited second version of the spectrogram with less computing effort. Sampling values of the third sampling rate can be obtained with high accuracy. Thus, polynomial interpolation can be obtained with little computing effort and with small signal deviations.

According to further embodiments, the processor is configured to apply a frequency window, for example an FIR filter, to the first version of the spectrogram and to obtain the second version of the spectrogram based on frequency portions for which the first frequency window comprises an absolute value of the function that is greater than a threshold. It is an advantage of this embodiment that a frequency domain of the frequency window can be flexibly adjusted, such that the second version can be obtained with a flexible bandwidth.

According to a further embodiment, the second version of the spectrogram can be represented with a quantity of frequency lines. The processor is configured to add a second quantity of frequency lines with a predefined value to the first quantity of frequency lines. A sum of the first quantity and the second quantity correspond to the smallest power of 2 with a natural number, wherein the power is greater than or equal to the first quantity. It is an advantage that the first quantity of frequency lines can be rounded up to a power of 2 of frequency lines that is not greater in order to allow efficient forming of the coarsely pre-modified information signal by means of inverse Fourier transformation.

Further embodiments provide an apparatus where the processor is configured to add a third quantity of frequency lines with the predefined value to the first quantity of frequency lines. The third quantity corresponds to one or three times the first or second quantity, such that all in all two or four times the quantity of frequency lines is obtained. This allows interpolation of the frequency lines such that a computing effort of the time domain interpolator can be low, since a high quantity of frequency lines and hence a high quantity of sampling values in the time domain comprises a predefined value.

According to further embodiments, the processor is configured to apply a first and at least a second frequency window to the first version of the spectrogram and to obtain the second version of the spectrogram based on frequency portions for which the first and the at least second frequency window have an absolute value of the function that is greater than the threshold. The first frequency window and the at least second frequency window have a group run time shifted with respect to one another. It is an advantage of this embodiment that, as an alternative or in addition to an interpolation of the frequency line by predefined values, an increased quantity of frequency lines of the second version can be obtained by applying several frequency windows.

According to a further embodiment, an apparatus further comprises a signal input that is configured to receive an input signal comprising a set value with respect to a sampling rate. The apparatus further comprises a control element that is configured to control the forward transformer, such that a length of the first transformation length is modified, or to control the processor such that a length of the second transformation length is modified. It is an advantage of this embodiment that based on a modified length of the first transformation length or the second transformation length, a ratio between the first and the second transformation length and a decimation rate of the apparatus, respectively, is adjustable.

According to a further embodiment, the set value of the input signal relates to the third sampling rate. The control element is configured to adjust the third sampling rate, such as fine adjustment of the time domain interpolator. An advantage thereof is that a high number of decimation rates, i.e., a ratio between the third sampling rate and the first sampling rate is adjustable. According to embodiments, the decimation rate is arbitrarily adjustable.

According to a further embodiment, a method for modifying a sampling rate includes forming a first version of a spectrogram by means of transformation with a first transformation length from an information signal with a first sampling rate. The method includes forming a second version of the spectrogram comprising a lower bandwidth than the first version and forming a coarsely pre-modified information signal with a second sampling rate that is reduced with respect to the first sampling rate, by means of reverse transformation of the second version with a second transformation length that is reduced with respect to the first transformation length. Further, the method includes acquiring an information signal with a third sampling rate that is modified with respect to the second sampling rate, by means of interpolation of the pre-modified information signal.

Further embodiments relate to a system with an apparatus for modifying a sampling rate and to a computer program.

BRIEF DESCRIPTION OF THE DRAWINGS

Embodiments of the present invention will be detailed subsequently referring to the appended drawings, in which.

DETAILED DESCRIPTION OF THE INVENTION

Before embodiments of the present invention will be discussed below in detail based on the drawings, it should be noted that identical, functionally equal or equivalent elements, objects and/or structures are provided with the same reference numbers in the different figures, such that the description of these elements illustrated in different embodiments is inter-exchangeable and inter-applicable.

Some of the embodiments described below relate to obtaining a first version of a spectrogram from an information signal comprising a first sampling rate. Embodiments are described such that a second version of a spectrogram is obtained based on the first version. The second version will be described below such that a bandwidth of the second version is reduced compared to the first version. Further, embodiments described below relate to the fact that an information signal with a second sampling rate is obtained based on the second version of the spectrogram, wherein the second sampling rate is reduced with respect to the first sampling rate. According to other embodiments, the second sampling rate can be increased with respect to the first sampling rate.

Figure 1:
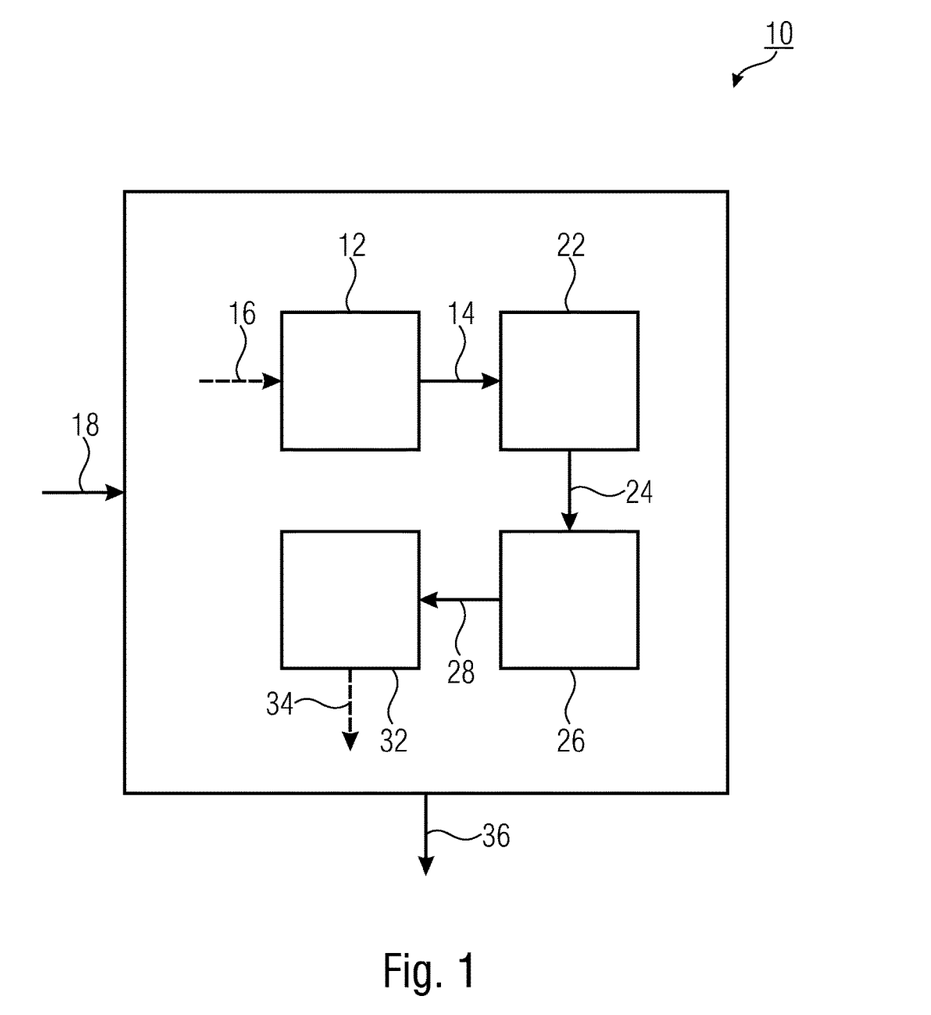
FIG. 1 is a schematic block diagram of an apparatus for modifying a sampling rate according to an embodiment.

FIG. 1 shows a schematic block diagram of an apparatus 10 for modifying a sampling rate. The apparatus 10 includes a forward transformer 12. The forward transformer 12 is configured to form a first version 14 of a spectrogram based on a transformation of an information signal 16. The information signal 16 can be a signal 18 received by the apparatus 10. The signal 18 can, for example, be a communication and/or a measurement signal. The information signal 16 can be the signal 18 or can be based thereon. The signal 18 can, for example, be preprocessed, such as filtered or pre-amplified. In particular, the information signal 16 can be a high-frequency signal which means a frequency of the signal can be at least 100 KHz, at least 1 MHz or at least 10 MHz. The information signal 16 comprises a first sampling rate. The forward transformer 12 is configured to form the first version 14 with a transformation having a first transformation length.

The information signal can be received in an oversampled manner. For further processing, reducing the degree of oversampling can be desirable such that a signal with reduced sampling rate is desired. The information signal can comprise, for example, any sampling rate, such as in a range of at least 10 Hz and at the most 100 GHz, of at least 1 MHz and at most 1 GHz or of at least 10 MHz and at the most 100 MHz, such as 20 MHz. The reduced sampling rate can have a lower value, such as 12.2 MHz.

The information signal 16 can be received by the forward transformer 12 as a time domain representation. The forward transformer 12 can be configured to transfer the time domain representation into a frequency domain representation during the transformation. The transformation, such as the transfer into the frequency domain, can have a first transformation length, such as at least a sectional length or frequency width of the spectrogram. The forward transformer 12 can be configured to apply fast Fourier transformation (FFT) to the information signal 16. A transformation length can relate to a quantity of frequency supporting points or frequency lines of the FFT transformation. Alternatively or additionally, the information signal 16 can be received as frequency domain representation. A transformation length of the FFT can have any value, such as of at least $2^5$ and at the most $2^{20}$, of at least $2^8$ and at most $2^{17}$, of at least $2^{10}$ and at most $2^{14}$. The transformation length of the FFT can also have a value of less than $2^5$. Advantageously, the transformation length is greater since, at a length of less than $2^5$, a quantity of coefficients for further operations can be low or too low. An upper limit for the transformation length can also be greater than $2^{20}$ and is, for example, influenced by a capacity of an available memory and/or a word width. However, for example, an efficiency of an FFT can already be ineffective at a transformation length of less than $2^{20}$ when the computing effort is considered. An increase of the transformation length of the FFT can be associated with disproportionate computing power requirements. In that way, for example, a quantity of N*ld(N) operations may be needed for a quantity of N*(1−Overlap) sampling values. Thus, a longer FFT can necessitate additional computing power per sampling value but can result in less effort for providing and collecting the data. A higher value of the transformation length can result in obtaining a higher quantity of coefficients for the window during fast convolution. However, above approximately 1000 coefficients, a practical use can remain constant or merely increase slightly.

The apparatus 10 includes a processor 22 for forming a second version 24 of the spectrogram. Compared to the first version 14, the second version 24 has lower bandwidth. Simply put, this can be considered as band limitation. The processor 22 can be configured to filter the first version 14. Alternatively or additionally, the processor 22 can be configured to apply a frequency window to the first version 14 of the spectrogram, such that the second version 24 is obtained based on frequency portions (frequency bins) of the first version 14 for which the first frequency window has a result (such as an absolute value of the function or an impulse response) that is greater than a threshold. The threshold can, for example, have a value in a range of at least 0 and at most 0.5, of at least 0 and at most 0.25 or of at least 0 and at most 0.1 of a maximum window absolute value or spectrogram value. The processor 22 can be configured to neglect frequency lines (frequency bins) for which a multiplication of the frequency window with the first version 14 results in a value that is smaller than the predefined threshold. Simply put, all frequency bins outside the window and/or below the threshold can be omitted, such that a reduced and possibly weighted quantity of frequency bins of the first version 14 is incorporated in the second version 24 of the spectrogram. Alternatively, the frequency window can, for example, be implemented as a filter such as FIR filter (Finite Impulse Response Filter).

The apparatus 10 includes a reverse transformer 26 for forming a coarsely pre-modified information signal 28. The coarsely pre-modified information signal 28 comprises a second sampling rate. The second sampling rate is modified, for example reduced, with respect to the first sampling rate of the information signal 16. The reverse transformer 26 is configured to form the pre-modified information signal 28 by means of reverse transformation of the second version 24 of the spectrogram. The pre-modified information signal can be a pre-decimated information signal or a signal having the same or increased bandwidth or sampling rate.

The reverse transformation of the second version 24 of the spectrogram has a transformation length which is modified with respect to the first transformation length of the transformation that is executable by the forward transformer 12. The second transformation length can have, for example, two, three or four times the value of the first transformation length. If the information signal has, for example, a sampling rate of 20 MHz, the pre-modified information signal can have a sampling rate of 40 MHz, 60 MHz and 80 MHz, respectively. Alternatively, the pre-modified information signal can also have a reduced sampling rate, such as 5 MHz, 10 MHz or 15 MHz.

Simply put, the reverse transformer 26 is configured to retransform the second version 24 into the time domain. The reverse transformer 26 can, for example, be configured to perform inverse FFT (IFFT) with a transformation length. The transformation length of the IFFT can be a multiple of the transformation length of the FFT (or vice versa). The reverse transformer 26 can be configured to apply an overlap&add or overlap&save method to a result of the reverse transformation in order to obtain the coarsely pre-modified information signal 28. Simply put, the reverse transformer 26 is configured to perform reconversion of the second version 24 into the time domain, such as by means of IFFT. The reverse transformer 26 can be configured to subsequently perform an overlap&add or overlap&save method.

The apparatus 10 includes a time domain interpolator 32 that is configured to obtain an information signal 34 with a third sampling rate by means of interpolation of the pre-modified information signal 28. The third sampling rate is modified with respect to the second sampling rate. The third sampling rate can be increased or reduced with respect to the second sampling rate. The time domain interpolator 32 can be configured, for example, to obtain the information signal 34 based on a polynomial interpolation. The time domain interpolator 32 can be configured, for example, to perform Lagrange interpolation. The time domain interpolator 32 can be configured to further process or evaluate a result of the interpolation, such as by means of a Horner scheme. Based on the reverse transformation with a second transformation length that is reduced with respect to the first transformation length, a first decimation of the information signal 16 can be obtained. The second sampling rate can, for example, be 80 MHz and the third sampling rate 12.2 MHz, such that the information signal 34 is decimated with respect to the information signal 16. This means that a difference between the first and third sampling rate (such as 20 MHz and 12.2 MHz) can be smaller as regards to the amount than a difference between the second and third sampling rate (such as 80 MHz and 12.2 MHz).

The processor 22 can be configured to supplement a quantity of frequency bins having the first version 14 of the spectrogram with frequency lines having a predefined value of the amplitude or magnitude. The predefined value can, for example, be a value in a range of at least 0 and at most 0.5, at least 0 and at most 0.2 and at least 0 and at most 0.1 of a maximum possible value, such as 0. The processor can be configured to supplement the quantity of frequency lines of the second version by means of the predefined frequency lines, such that, in total, a quantity of frequency lines is obtained that corresponds to a value of the smallest power of 2 with a natural number and is at the same time greater than or equal to the quantity of frequency lines of the second version 24. Simply put, the quantity of frequency bins can be padded with values, such as zeros, in order to reach the next greater quantity according to a power of two. Thus, the described padding allows obtaining a quantity of $2^n$ frequency bins desirable for IFFT methods. By padding, (synthetic) generation of information is reduced or prevented, such that reverse transformation can be performed with little computing effort.

Additionally, the processor can be configured to add a third quantity of frequency lines with the predefined value to the first quantity of frequency lines. The third quantity can correspond to a further power of 2 with a natural number minus 1, such that, in total, a value of a power of 2 with a natural number results again from the sum of the first quantity, the second quantity and the third quantity. The third quantity can, for example, correspond to the sum of the first quantity and the second quantity, such that the third quantity results in a duplication, i.e., factor 2 and $2^1$, respectively. Alternatively, the third quantity can correspond to three times the quantity of the sum of the first quantity and the second quantity, such that all in all four times the quantity of the sum of the first and second quantities, i.e., factor 4 and, hence, number $2^2$ is obtained.

The apparatus 10 is configured to output an information signal 36 that is based on the information signal 34.

By means of the interpolation of the time domain interpolator, the first sampling rate can be increased or reduced with respect to the second sampling rate. A difference between the second sampling rate and the third sampling rate can be lower than a difference of the second sampling rate and the first sampling rate. The information signal 34 can also be referred to as finely modified or decimated information signal.

The interpolation allows obtaining the second sampling rate, wherein here, possibly, for example, some fixed ratios between the first sampling rate and the second sampling rate are determined in order to obtain high calculation efficiency. Fine adjustment of the sampling rate can be obtained by subsequent interpolation of the second sampling rate, wherein the same has a lower computing effort based on the already coarsely pre-modified sampling rate and results in minor neglectable interpolation errors. The interpolation can be limited to a degree of complexity which is less than or equal to a degree of complexity that is necessitated for determining an interpolation rate between two fixed stages of the ratio of the first and second sampling rates. Simply put, the interpolation can be used merely for intermediate ranges of sampling rates that lie between two sampling rates of the coarsely pre-modified information signal 28. Alternatively, a difference between the first and second sampling rates can also be smaller than a difference between the second and third sampling rates.

The time domain interpolator 32 can be configured to obtain a sampling value of the third sampling rate of the information signal 34 based on at least two sampling values of the second sampling rate of the pre-modified information signal 28. A polynomial interpolation can be performed with a degree which is based on a quantity of existing sampling values of the pre-modified information signal 28 which is used for obtaining a sampling value. In that way, for example, a sampling value of the information signal 34 can be arranged between a plurality of sampling values of the coarsely pre-modified information signal 28. A maximum degree of the polynomial interpolation can correspond, for example, to the plurality of sampling values minus 1. A quantity of sampling values that is used for the interpolation or polynomial interpolation can lie in a range of at least two and at most eight, at least two and at most seven or in a range of at least three and at most five sampling values. The polynomial interpolation can be performed with a degree that lies in a range between one and seven, between one and six or between two and four.

Figure 2:
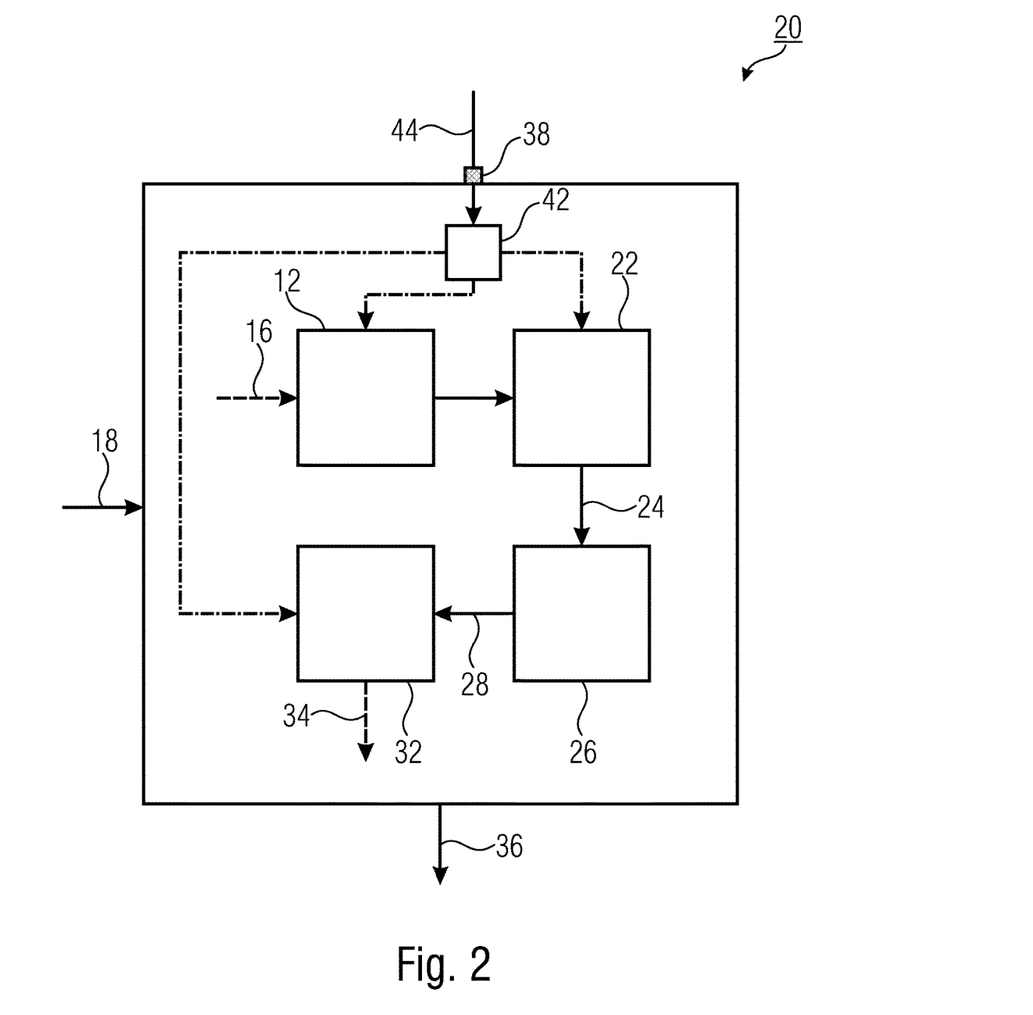
FIG. 2 is a schematic block diagram of an apparatus for modifying a sampling rate comprising a control element according to an embodiment.

FIG. 2 shows a schematic block diagram of an apparatus 20 for modifying a sampling rate. Compared to the apparatus 10, the apparatus 20 further comprises a signal input 38 and a control element 42. The apparatus is configured to receive an input signal 44 by means of the signal input 38. The input signal 44 can, for example, be a user input. The input signal can include an instruction relating to a sampling rate of the finally modified signal to be adjusted, to a ratio between input and output sampling rate or to a decimation rate. The input signal 44 can have a set value with respect to a sampling rate. This can be the first, second and/or third sampling rate.

The control element 42 can be configured to control the forward transformer 32. The control can relate to a length of the first transformation length, this means the control element 42 can be configured to control the forward transformer such that a length of the first transformation length is modified. Alternatively or additionally, the control element 42 can be configured to control the processor 22 such that a length of the second transformation length is modified. This can be performed, for example, based on a modification of the frequency window and/or based on a modification of the threshold for selecting frequency domain lines. Simply put, the control element 42 can be configured to influence a ratio between the first sampling rate and the second sampling rate based on a modification of the first sampling rate and/or the second sampling rate.

Alternatively or additionally, the control element 42 can be configured to control the time domain interpolator 32 such that the same modifies or adjusts the third sampling rate of the information signal 34. Controlling the time domain interpolator 32 can, for example, be performed by means of a set value at what intervals sampling values of the coarsely pre-modified information signal 28 are to be interpolated.

Figure 3:
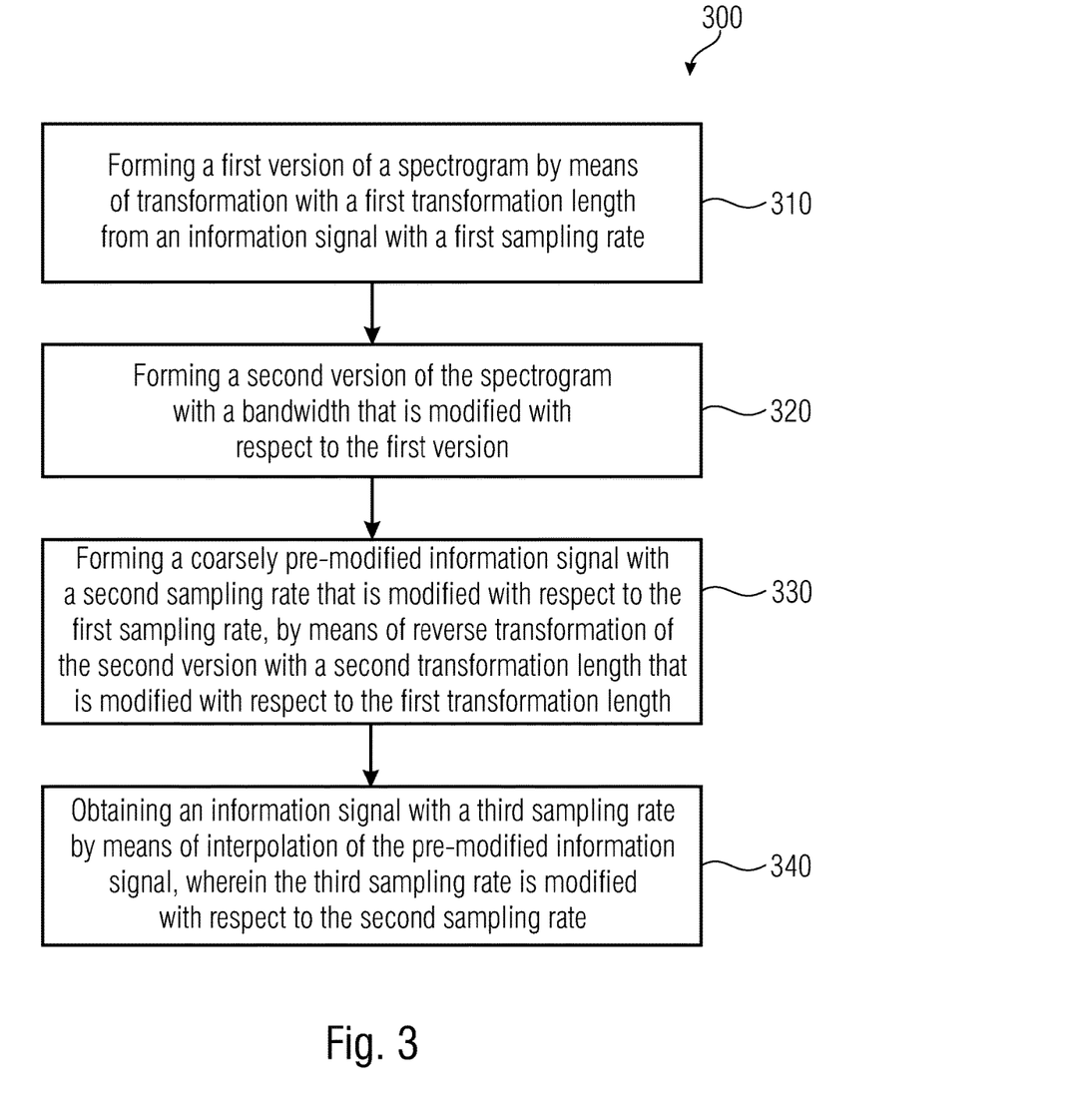
FIG. 3 is a schematic flow diagram of a method for modifying a sampling rate according to an embodiment.

FIG. 3 shows a schematic flow diagram of a method 300 for modifying a sampling rate. The method 300 includes a step 310 where a first version of a spectrogram is formed by means of a transformation with a first transformation length from an information signal comprising a first sampling rate. For this, time domain data obtained, for example, by an analog/digital converter can be converted into the frequency domain. For this, so-called zero-padding can be used. Conversion can be performed by means of an FFT having the length N1.

A step 320 includes forming a second version of the spectrogram having a lower bandwidth with respect to the first version. For this, a multiplicative window or a filter (for example FIR) can be applied in order to select a desired frequency domain with N2 coefficients wherein, for example, $N2 \leq N1$ or $N2 \geq N1$. The multiplicative window or the FIR filter can be applied, for example, by means of the processor 22. Frequency bins that are outside the window or not returned by the FIR filter can be omitted, such that the N2 frequency bins remain.

A step 330 includes forming a coarsely pre-modified information signal with a second sampling rate which is modified with respect to the first sampling rate, for example increased, by means of a reverse transformation of the second version with a second transformation length which is modified with respect to the first transformation length. This can take place, for example, based on a reverse transformation of the second version into the time domain. The reverse transformation can be performed by means of an IFFT of the length N3 and possibly subsequent overlap&add or overlap&save. The value N3 can be equal to the value N2. Alternatively, the value N3 can also be a power of 2 with a natural number that is greater than the value of a natural logarithm of the number N2. For example, the processor can be configured to pad the quantity of N2 frequency bins with a quantity of frequency bins with predefined values (such as zeroes) in order to reach the power of two. This can be represented by:

$$N3 = 2^{(ceil(id(N2))+nOvs1)}$$

The parameter nOvs1 can be referred to as oversampling parameter and can have a value of 0 or a natural number. The term ceil(id(N2)) can be considered such that a second quantity of frequency lines having a predefined value is added to a first quantity of frequency lines of the second version. Adding can be represented by means of a rounding function (ceil). The second quantity can correspond to the quantity of frequency bins added by the rounding up. A sum of the first quantity and the second quantity can correspond to the rounded-up smallest power of 2 with a natural number, wherein the result of the power of 2 with a natural number is greater than or equal to the first quantity.

The oversampling parameter nOvs1 can have, for example, a value of at least 0 and at most 5 of at least 0 and at most 3 or of at least 0 and at most 2. If the parameter nOvs1 has, for example, the value 1, the third quantity has the value of the sum of the first and second quantity, i.e. duplication is obtained. If the parameter nOvs1 has, for example, the value 2, for example, the power with an exponent increased by 2 is obtained, such that quadruplication is obtained, which means that the third quantity corresponds to three times the sum of the first and second quantities.

A step 340 includes obtaining an information signal with a third sampling rate which is modified with respect to the second sampling rate by means of interpolation of the pre-modified information signal.

The above-described parameter nOvs1 can, for example, also have the value 0, for example in order to let the second transformation length, representable by the quantity N3 not become too large, which can result in low memory requirements.

In such a case, for example, a quantity of $2^{nOvs2}$ windows can be used which are applied to the first version of the spectrogram, for example by using the processor. The second version of the spectrogram can be obtained based on frequency portions for which the first and the at least second frequency window have an absolute value of the function that is greater than the threshold. The first frequency window and the at least second frequency window can have a group run time which is shifted with respect to one another. For example, in the step 320, parallel application of $2^{nOvs2}$ windows with the same operating frequency response and mutually offset group run times can be performed. The first quantity (N2) of frequency bins can be padded with the predefined values in order to reach the next higher power of 2, such as according to $NE=2^{(ceil(id(N2)))}$. The parameters nOvs1 and nOvs2 can have, for example, a mutual relationship. The relationship can, for example, be formulated such that the parameters nOvs1 and nOvs2 have a variable value while a sum of the parameters has a constant value, 0 and at most 5, at least 0 and at most 3 or at least 0 and at most 2. This can be simply understood as predetermined measure of oversampling which is enabled completely or partly by padding the frequency bins (nOvs1) and/or completely or partly by obtaining an increased quantity of frequency bins during windowing (nOvs2).

The reverse transformer can be configured to perform parallel reverse transformation, possibly including overlap&add or overlap&save and subsequent interleaving of the obtained output data, such that again a time domain data stream results which is interpolated by the factor $2^{nOvs}$. Simply put, instead of the increased quantity of predefined values, an increased quantity of values obtained by means of the frequency window is obtained.

Figure 4A:
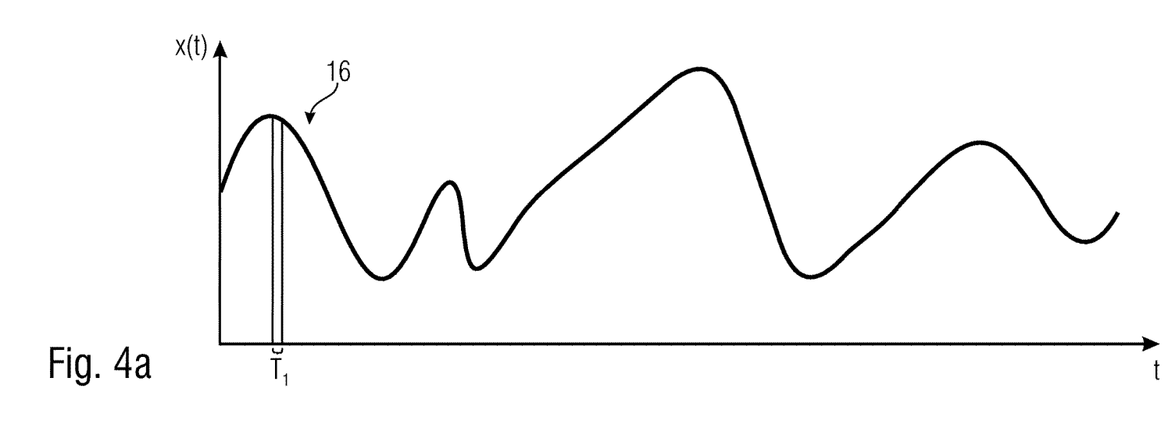
FIG. 4a is a schematic course of an information signal in the time domain according to an embodiment.

FIG. 4a shows a schematic course of the information signal 16 in the time domain. An amplitude x(t) of the information signal 16 is plotted over a time axis t. The information signal 16 has a sampling rate $1/T_1$.

Figure 4B:
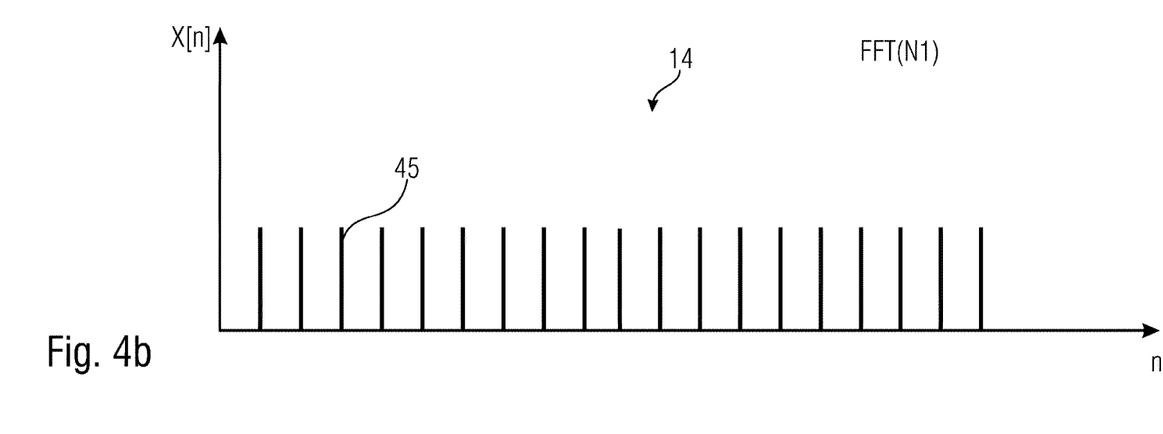
FIG. 4b is a schematic illustration of a first version of a spectrogram of the information signal of FIG. 4a according to an embodiment.

FIG. 4b shows schematically the first version 14 of the spectrogram where a quantity of N1 frequency bins 45 is obtained, such as based on an FFT of the transformation length N1. The frequency bins 45 are illustrated in a simplified manner as equidistant lines with the same amplitudes but can have differing frequency intervals and/or differing amplitudes. The spectrogram shows a simplified illustration where n refers to the frequency bins at the abscissa and the ordinate X[n] refers to the amplitude.

Figure 4C:
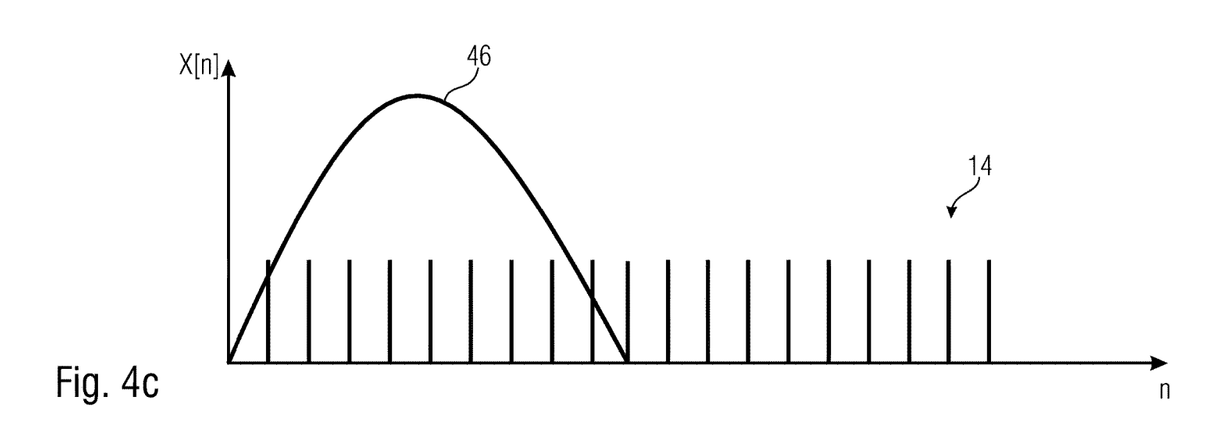
FIG. 4c is a schematic illustration of an application of a frequency window to the first version according to an embodiment.

FIG. 4c shows schematically an application of a frequency window 46 to the first version 14 as described, for example in the context of the processor. The frequency window 46 can be any frequency window. The frequency window 46 can comprise, for example, a window function, such as a cosine window, a Hamming window, a Gaussian window, a rectangular window or the same. Alternatively, the frequency window 46 can also be implemented as FIR filter. An impulse response of the FIR filter can be a result of an application of the frequency window to a signal.

Figure 4D:
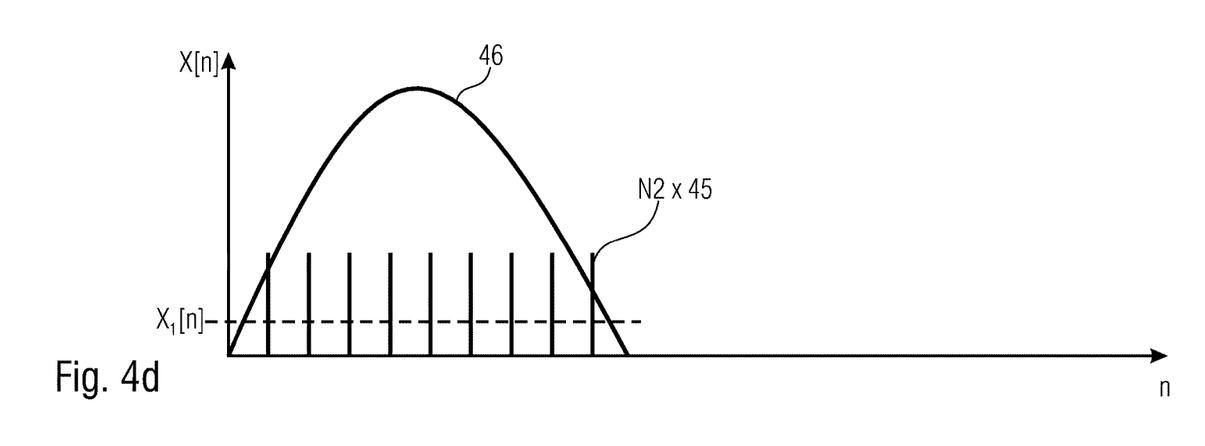
FIG. 4d is a schematic illustration of omitting frequency bins for which an absolute value of the frequency window falls below a threshold, according to an embodiment.

FIG. 4d shows a schematic omission of frequency bins for which an absolute value of the window function 46 falls below a threshold $X_1[n]$. Alternatively, frequency bins can be removed for which a multiplication of the amplitude of the respective frequency bins 45 falls below the threshold $X_1[n]$. If, in a simplified manner, a rectangular window is considered, this can apply to frequency bins that are arranged outside the window. If alternatively, an FIR filter is considered, this can apply to frequency bins for which the FIR filter provides no impulse response or to frequency bins whose impulse response remains unconsidered. If the frequency window is, for example, implemented as FIR filter, the frequency bins 45 can be an impulse response of the FIR filter which is obtained based on the first version 14 from the FIR filter. Based on the frequency window, a quantity of N2 frequency bins 45 can be obtained.

Figure 4E:
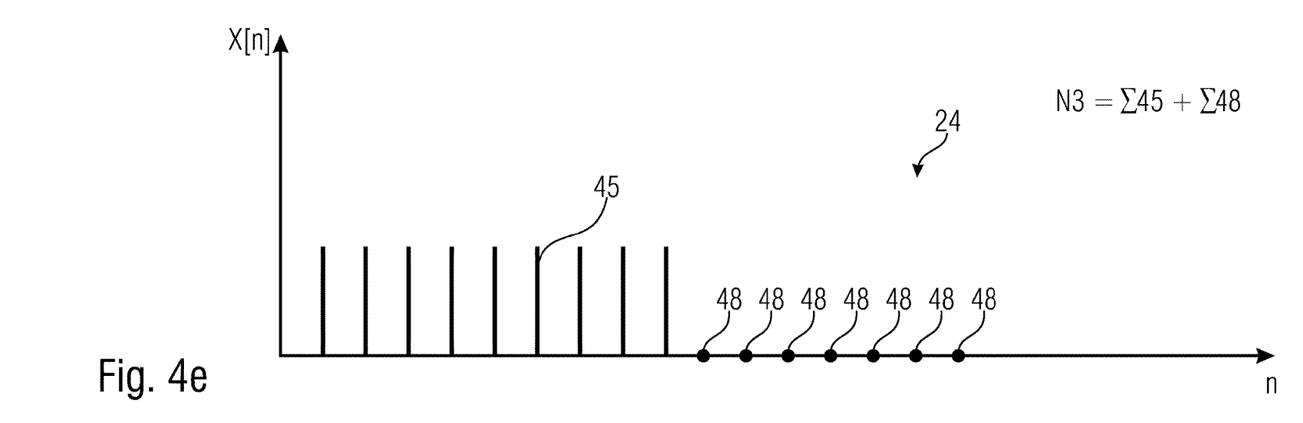
FIG. 4e is a schematic illustration of adding predefined values to the frequency bins in order to obtain a second version of the spectrogram, according to an embodiment.

FIG. 4e shows schematically adding of predefined values 48 to the frequency bins 45 to obtain the second version 24. The predefined values 48 are, for example, also frequency bins with a predefined value. The predefined value has, for example, an amplitude value of X[n] of 0. A quantity of frequency bins 45 and predefined values 48 corresponds, for example, to 16 (9 frequency bins 45 and 7 predefined values 48), such that all in all a quantity of $16=2^4$ values is obtained. Thus, the first quantity can, for example, be 9. The second quantity can, for example, be 7, wherein a second transformation length can, for example, be 16. The illustrated numerical values are exemplarily. Embodiments relate to transformation lengths in a range of at least $2^5$ and at most $2^{20}$, of at least $2^8$ and at most $2^{17}$ or of at least $2^{10}$ and at most $2^{14}$. Compared to the first version 14, the second version 24 has a reduced bandwidth. If the frequency window 46 is implemented, for example, as FIR filter, the impulse response of the FIR filter can be padded with the predefined values.

Figure 4F:
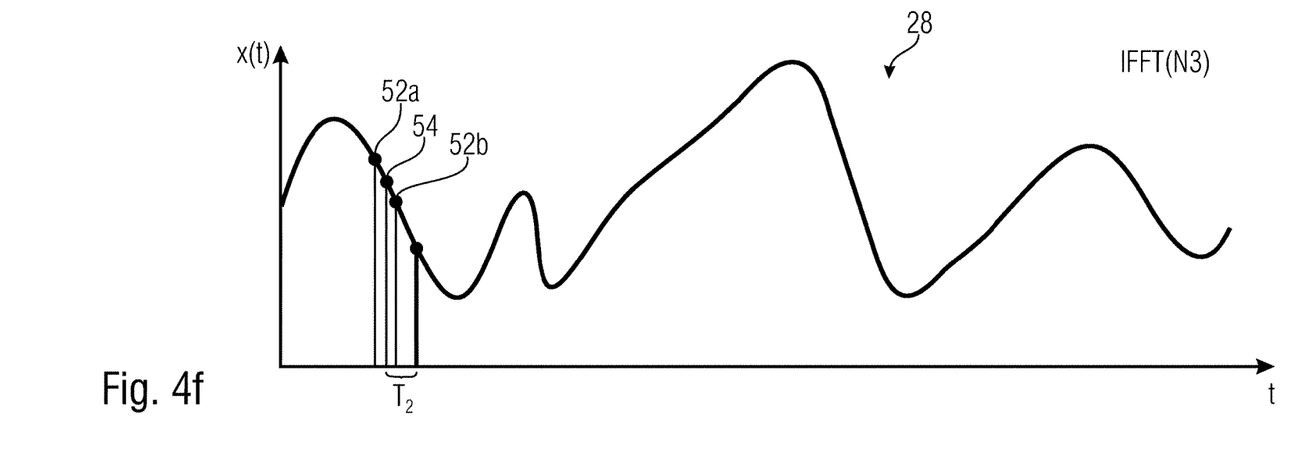
FIG. 4f is a schematic illustration of a course of a predefined information signal in the time domain.

FIG. 4f shows schematically a course of the coarsely predefined information signal 28 in the time domain. As described in the context of the time domain interpolator 32, based on sampling values (time domain samples) 52a and 52b between which a sampling value 54 to be obtained is arranged, one of a sampling rate $1/T_2$, a plurality of sampling values 54 can be obtained. The sampling rate $1/T_2$ can be smaller than the sampling rate $1/T_1$. The sampling rate $1/T_2$ of the obtained information signal can be increased or reduced with respect to the sampling rate of the pre-modified information signal.

Figure 5A:
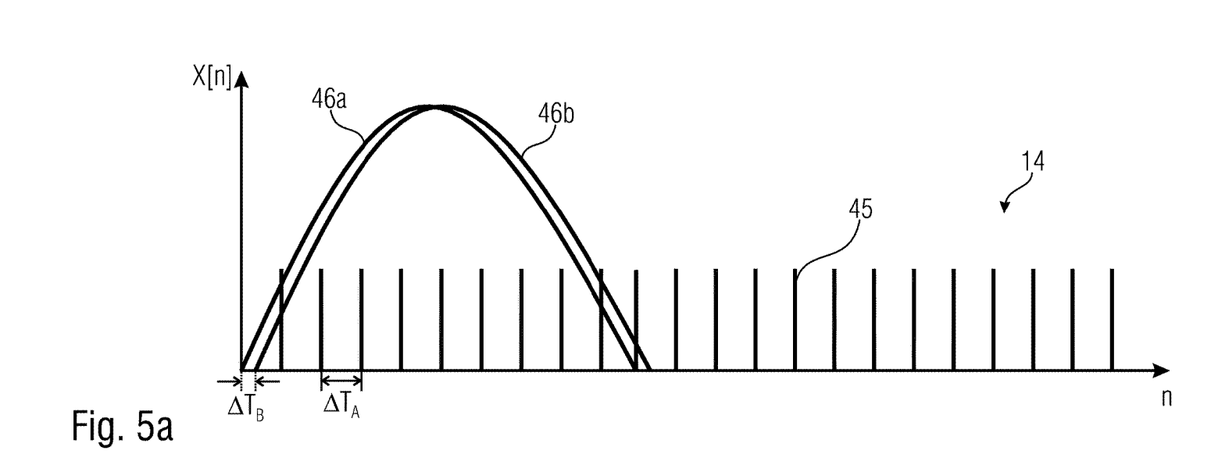
FIG. 5a is a schematic illustration of an application of a first frequency window and a second frequency window to the frequency bins of the first version according to an embodiment.

FIG. 5a shows schematically an application of a first frequency window 46a and a second frequency window 46b to the frequency bins 45 of the first version 14. Compared to FIG. 4c, an increased quantity of frequency bins 45 is multiplied or obtained with frequency windows 46a and 46b. Simply put, the frequency window 46a allows obtaining a first subset of frequency bins 45 and the frequency window 46 allows obtaining a second subset of frequency bins 45.

The frequency windows 46a and 46b can have the same or comparable absolute value frequency response and group runtimes that are offset with respect to one another. The group runtimes can have any offset $\Delta T_B$. For example, a summed-up offset of the group runtimes of the frequency windows can correspond, approximately, to a time difference $\Delta T_A$ between two sampling values of the first version, such as in a tolerance range of 100%, 50% or 10%. The image of FIG. 5a is to be considered as being schematically with respect to illustrated time shifts and relates to sampling values.

If the processor is configured, for example, to apply a first and a second frequency window, an offset $\Delta T_B$ of the group runtime can correspond to, for example 50% of the time difference $\Delta T_A$ between two sampling values. If the processor is configured, for example to apply four frequency windows, an offset of the second, third and fourth frequency window to the first frequency window can correspond, for example to 25%, 50% and 75% of the time difference between two sampling values.

Figure 5B:
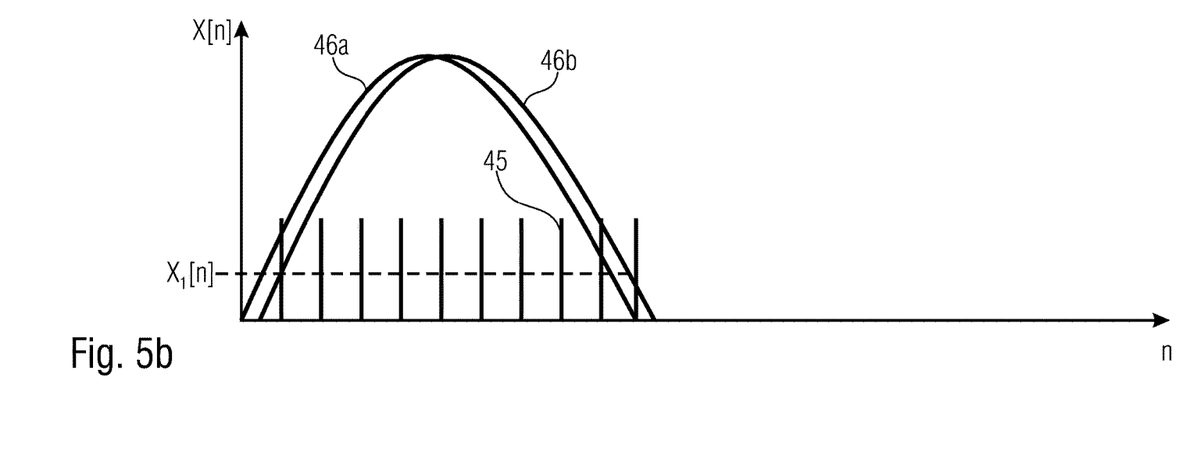
FIG. 5b is a schematic illustration of omitting frequency bins for which a value of the multiplication of the frequency bins with the frequency windows or the absolute value of the frequency window falls below the threshold, according to an embodiment.

FIG. 5b shows schematically on omission of frequency bins 45 for which a value of the multiplication of the frequency bins 45 with the frequency windows 46a and/or 46b or the absolute value of the frequency windows 46a and 46b falls below the threshold $X_1[n]$. Alternatively, the frequency bins can be obtained by applying a first FIR filter and a second FIR filter and by multiple use of an FIR filter, respectively.

Figure 5C:
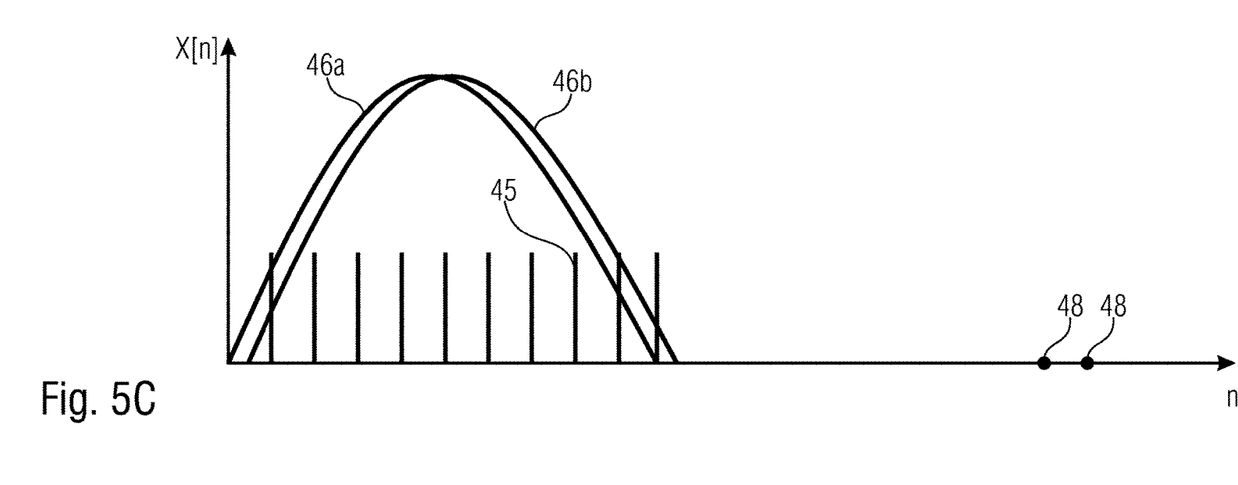
FIG. 5c is a schematic illustration of adding the predefined value according to FIG. 4e according to an embodiment.

FIG. 5c shows adding the predefined values 48 according to FIG. 4e, wherein based on the quantity of frequency bins 45 (first and second subset) increased due to the increased quantity of frequency windows, a lower quantity of padding values (values 48) can be necessitated in order to reach the next higher power of two.

Above-described embodiments advantageously use the application of one or several multiplicative windows. This allows accurately fitting band limitation of the input data without additional computing effort. By applying fast convolution (FFT), steep-edge filters can be realized. By means of supplementing the frequency bin with the predefined values, fast implementation of IFFT can be used for reverse transformation, such as when the parameter nOvs is equal to 0. If the parameter nOvs has a different value, such as 1 or 2, interpolation of the data by the factor 2 or 4 can be performed. This can relieve the polynomial interpolation of the time domain interpolator and enable high signal quality with SFDR values of more than 60 dB, more than 70 dB or more than 80 dB.

Figure 6:
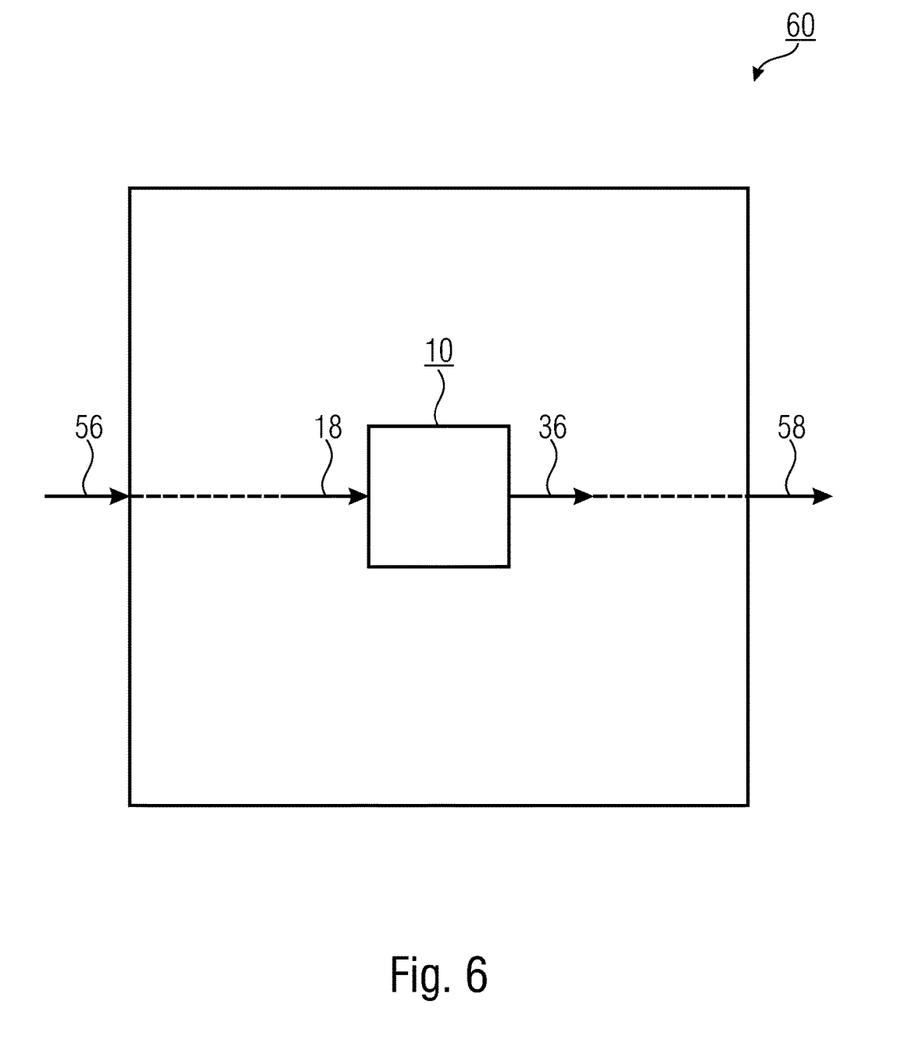
FIG. 6 is a schematic block diagram of a system comprising the apparatus, according to an embodiment.

FIG. 6 shows a schematic block diagram of a system 60 comprising the apparatus 10. The system 60 can, for example, be a high-frequency receiver. Alternatively, the apparatus 20 can also be arranged. The system 60 is configured to receive a signal 56 and to provide the information signal 18 based on the signal 56. The system 60 can be configured to output a signal 58 based on the information signal 36 or 34. The signal 58 can be a signal having information regarding the graphical illustration of the information signal 36. Alternatively, the signal 58 can also be the signal 36 and/or a high-frequency signal. The signal 56 can be a high-frequency signal. The system can, for example, be part of a receive apparatus.

In other words, embodiments can be used in high-frequency receivers. The high-frequency receiver can be configured to process the received signals in a digital manner. In embodiments, it can be advantageous when the received signals have already been transformed into the frequency domain.

Although some aspects have been described in the context of an apparatus, it is obvious that these aspects also represent a description of the corresponding method, such that a block or device of an apparatus also corresponds to a respective method step or a feature of a method step. Analogously, aspects described in the context of a method step also represent a description of a corresponding block or detail or feature of a corresponding apparatus.

Depending on certain implementation requirements, embodiments of the invention can be implemented in hardware or in software. The implementation can be performed using a digital storage medium, for example a floppy disk, a DVD, a Blu-Ray disc, a CD, an ROM, a PROM, an EPROM, an EEPROM or a FLASH memory, a hard drive or another magnetic or optical memory having electronically readable control signals stored thereon, which cooperate or are capable of cooperating with a programmable computer system such that the respective method is performed. Therefore, the digital storage medium may be computer readable. Some embodiments according to the invention include a data carrier comprising electronically readable control signals, which are capable of cooperating with a programmable computer system, such that one of the methods described herein is performed.

Generally, embodiments of the present invention can be implemented as a computer program product with a program code, the program code being operative for performing one of the methods when the computer program product runs on a computer. The program code may, for example, be stored on a machine readable carrier.

Other embodiments comprise the computer program for performing one of the methods described herein, wherein the computer program is stored on a machine readable carrier.

In other words, an embodiment of the inventive method is, therefore, a computer program comprising a program code for performing one of the methods described herein, when the computer program runs on a computer. A further embodiment of the inventive methods is, therefore, a data carrier (or a digital storage medium or a computer-readable medium) comprising, recorded thereon, the computer program for performing one of the methods described herein.

A further embodiment of the inventive method is, therefore, a data stream or a sequence of signals representing the computer program for performing one of the methods described herein. The data stream or the sequence of signals may, for example, be configured to be transferred via a data communication connection, for example via the Internet.

A further embodiment comprises a processing means, for example a computer, or a programmable logic device, configured to or adapted to perform one of the methods described herein.

A further embodiment comprises a computer having installed thereon the computer program for performing one of the methods described herein.

In some embodiments, a programmable logic device (for example a field programmable gate array, FPGA) may be used to perform some or all of the functionalities of the methods described herein. In some embodiments, a field programmable gate array may cooperate with a microprocessor in order to perform one of the methods described herein. Generally, the methods are performed by any hardware apparatus. This can be a universally applicable hardware, such as a computer processor (CPU) or hardware specific for the method, such as ASIC.

While this invention has been described in terms of several advantageous embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

The invention claimed is:

1. Apparatus for modifying a sampling rate, comprising:
a forward transformer for forming a first version of a spectrogram by means of transformation with a first transformation length from an information signal with a first sampling rate;
a processor for forming a second version of the spectrogram comprising a bandwidth that is modified with respect to the first version;
a reverse transformer for forming a coarsely pre-modified information signal with a second sampling rate that is modified with respect to the first sampling rate, by means of reverse transformation of the second version of the spectrogram with a second transformation length that is modified with respect to the first transformation length; and
a time domain interpolator for acquiring an information signal with a third sampling rate that is modified with respect to the second sampling rate, by means of interpolation of the pre-modified information signal.

2. Apparatus according to claim 1, wherein the time domain interpolator is configured to interpolate the pre-modified information signal with the third sampling rate such that a difference between the first sampling rate and the third sampling rate is lower than a difference between the second sampling rate and the third sampling rate, wherein the information signal with the third sampling rate is a finely modified information signal.

3. Apparatus according to claim 1, wherein the time domain interpolator is configured to interpolate the pre-modified information signal with the third sampling rate such that the third sampling rate is reduced with respect to the second sampling rate.

4. Apparatus according to claim 1, wherein the time domain interpolator is configured to acquire sampling values of the third sampling rate by means of polynomial interpolation, wherein the polynomial interpolation is based on sampling values of the second sampling rate.

5. Apparatus according to claim 4, wherein the time domain interpolator is configured to acquire a sampling value of the third sampling rate based on at least two and at the most eight sampling values of the second sampling rate or to perform polynomial interpolation with a degree, wherein the degree comprises a value of at least 1 and at the most 7.

6. Apparatus according to claim 1, wherein the processor is configured to apply a first frequency window to the first version of the spectrogram and to acquire the second version of the spectrogram based on frequency portions (45) for which the first frequency window comprises an absolute value of the function that is greater than a threshold ($X_1[n]$).

7. Apparatus according to claim 6, wherein the processor is configured to apply at least a second frequency window to the first version of the spectrogram and to acquire the second version of the spectrogram based on frequency portions for which the first and the at least second frequency window provide a result that is greater than the threshold, wherein the first frequency window and the at least second frequency window comprise group runtimes that are shifted with respect to one another.

8. Apparatus according to claim 1, comprising:
a signal input that is configured to receive an input signal comprising a set value with respect to a sampling rate,
a control element that is configured to control the forward transformer such that a length of the first transformation length is modified or to control the processor such that a length of the second transformation length is modified.

9. Apparatus according to claim 8, wherein the set value relates to the third sampling rate and wherein the control element is configured to adjust the third sampling rate of the time domain interpolator.

10. Apparatus according to claim 8, wherein the set value relates to the third sampling rate and wherein the control element is configured to control a frequency domain of a frequency window, wherein the bandwidth of the second version of the spectrogram is influenced by the frequency domain of the frequency window.

11. Apparatus according to claim 1, wherein the second version of the spectrogram is representable by a first quantity of frequency lines, wherein the processor is configured to add a second quantity of frequency lines with a predefined value to the first quantity, wherein a sum of the first quantity and the second quantity of the smallest power of two corresponds to a natural number that is greater than or equal to the first quantity.

12. Apparatus according to claim 11, wherein the processor is configured to add a third quantity of frequency lines with a predefined value to the first quantity of frequency lines, wherein the third quantity corresponds to one or three times the first and the second quantity.

13. Apparatus according to claim 1, wherein the reverse transformer is configured to acquire the coarsely pre-modified information signal based on an overlap&add method or based on an overlap&save method.

14. System comprising an apparatus according to claim 1, wherein the system is configured to output a signal that is based on the information signal.

15. Method for modifying a sampling rate, comprising:
forming a first version of a spectrogram by means of transformation with a first transformation length from an information signal with a first sampling rate;
forming a second version of the spectrogram comprising a lower bandwidth than the first version;
forming a coarsely pre-modified information signal with a second sampling rate that is modified with respect to the first sampling rate, by means of reverse transformation of the second version with a second transformation length that is modified with respect to the first transformation length; and
acquiring an information signal with a third sampling rate that is modified with respect to the second sampling rate, by means of interpolation of the pre-modified information signal.

16. A non-transitory digital storage medium having a computer program stored thereon to perform the method for modifying a sampling rate, the method comprising:
forming a first version of a spectrogram by means of transformation with a first transformation length from an information signal with a first sampling rate;
forming a second version of the spectrogram comprising a lower bandwidth than the first version;
forming a coarsely pre-modified information signal with a second sampling rate that is modified with respect to the first sampling rate, by means of reverse transformation of the second version with a second transformation length that is modified with respect to the first transformation length; and acquiring an information signal with a third sampling rate that is modified with respect to the second sampling rate, by means of interpolation of the pre-modified information signal, when said computer program is run by a computer.

* * * * *